United States Patent [19]

Miller et al.

[11] Patent Number: 5,325,019
[45] Date of Patent: Jun. 28, 1994

[54] CONTROL OF PLASMA PROCESS BY USE OF HARMONIC FREQUENCY COMPONENTS OF VOLTAGE AND CURRENT

[75] Inventors: Paul A. Miller, Albuquerque, N. Mex.; Mattan Kamon, Cambridge, Mass.

[73] Assignee: Sematech, Inc., Austin, Tex.

[21] Appl. No.: 934,091

[22] Filed: Aug. 21, 1992

[51] Int. Cl.⁵ .............................................. H01J 7/24
[52] U.S. Cl. ........................ 315/111.21; 315/111.31; 315/111.91; 315/111.71; 204/192.13
[58] Field of Search ............ 315/111.21, 111.31, 315/111.91, 111.71; 156/345, 627; 204/192.13

[56] References Cited

U.S. PATENT DOCUMENTS

| | | | |
|---|---|---|---|
| 4,207,137 | 6/1980 | Tretola | 156/627 |
| 4,242,188 | 12/1980 | Niinomi et al. | 204/164 |
| 4,263,088 | 4/1981 | Gorin | 156/626 |
| 4,399,013 | 8/1983 | Sugita et al. | 204/192 |
| 4,579,618 | 4/1986 | Celestino et al. | 156/345 |
| 4,579,639 | 4/1986 | Enomoto et al. | 204/192 |
| 4,589,123 | 5/1986 | Pearlman et al. | 315/111.7 |
| 4,602,981 | 7/1986 | Chen et al. | 156/627 |
| 4,617,079 | 10/1986 | Tracy et al. | 156/345 |
| 4,622,094 | 11/1986 | Otsub | 156/627 |
| 4,664,767 | 5/1987 | Kudo et al. | 204/164 |
| 4,795,529 | 1/1989 | Kawasaki et al. | 156/643 |
| 4,812,712 | 3/1989 | Ohnishi et al. | 315/176 |
| 4,824,546 | 4/1989 | Ohmi | 204/298 |
| 4,846,920 | 7/1989 | Keller et al. | 156/345 |
| 4,874,494 | 10/1989 | Ohmi | 204/192 |
| 4,877,999 | 10/1989 | Knapp et al. | 315/111.2 |
| 4,935,661 | 6/1990 | Heinecke et al. | 315/111.9 |
| 4,950,376 | 8/1990 | Hayashi et al. | 204/192 |
| 4,956,043 | 9/1990 | Kanetomo et al. | 156/345 |
| 4,968,374 | 11/1990 | Tsukada et al. | 156/345 |
| 5,077,499 | 12/1991 | Oku | 315/111.21 |
| 5,140,223 | 8/1992 | Gesche et al. | 315/111.21 |
| 5,210,466 | 5/1993 | Collins et al. | 315/111.21 |
| 5,230,740 | 7/1993 | Pinneo | 315/111.21 X |

OTHER PUBLICATIONS

Pending Patent Application Serial No. 893,475, Filed Jun. 4, 1992 "Harmonic and Subharmonic Isolator for Plasma Discharge", Paul A. Miller.

"Electrical characterization of rf plasmas;" Paul A. Miller; SPIE, vol. 1594, Process Module Metrology, Control, and Clustering; pp. 179–188; Sep. 1991.

*Primary Examiner*—Robert J. Pascal
*Assistant Examiner*—Reginald A. Ratliff

[57] ABSTRACT

The present invention provides for a technique for taking advantage of the intrinsic electrical non-linearity of processing plasmas to add additional control variables that affect process performance. The technique provides for the adjustment of the electrical coupling circuitry, as well as the electrical excitation level, in response to measurements of the reactor voltage and current and to use that capability to modify the plasma characteristics to obtain the desired performance.

12 Claims, 4 Drawing Sheets

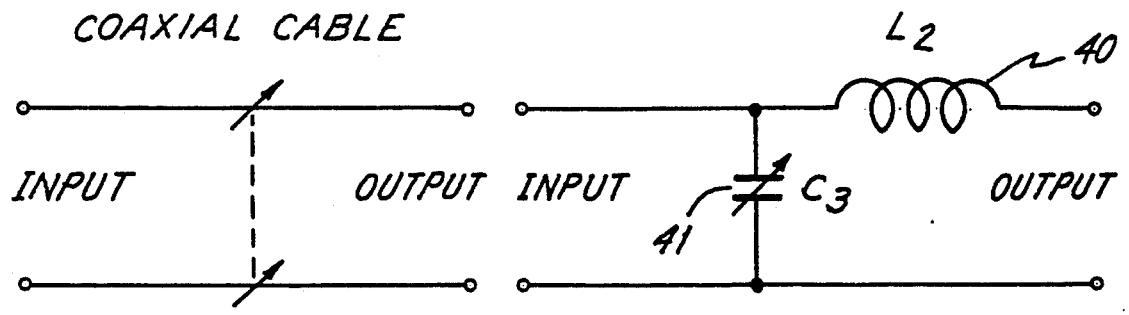
Fig. 5
Fig. 6
Fig. 9
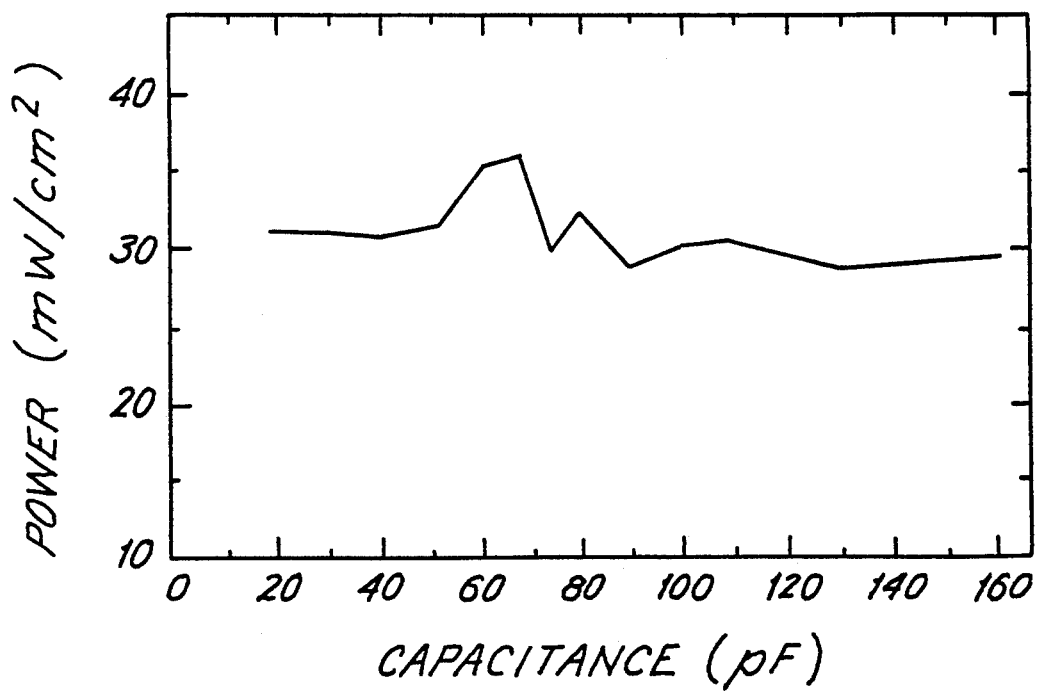

ated pursuant to Contract No. DE-FI04-89AL58872 between the Department of Energy and SEMATECH, INC.

CONTROL OF PLASMA PROCESS BY USE OF HARMONIC FREQUENCY COMPONENTS OF VOLTAGE AND CURRENT

The United States Government has rights in this invention pursuant to Contract No. DE-FI04-89AL58872 between the Department of Energy and SEMATECH, INC.

BACKGROUND OF THE INVENTION

1. Field of the Invention

The present invention relates to the field of plasma processing and, more particularly, to the use of plasma equipment for modification of materials.

2. Prior Art

Plasma processing equipment is used extensively in the industry for the modification of materials. These modifications include etching and deposition of films for fabrication of microelectronic circuits in semiconductor devices. The modification may also include implantation of chemical species that change the friction and wear properties of surfaces.

Plasmas generated by high-frequency electrical discharges have important technological applications, including the processing of materials for the fabrication of microelectronic circuits. As technology advances due to competition, industry requires and benefits from improving control over the properties of these plasmas.

A plasma is a gas (or a gas mixture) which is energized so that it is partially decomposed into species that are electrically charged. A variety of techniques are known for energizing the gas. One commonly used technique is the energizing of the gas by imposing on the gas an electric field from an external source. A common practice is to use high frequency alternating current (AC) fields to energize or excite the gas. Techniques for utilizing radio frequency (RF), as well as microwave fields of higher frequencies are well-known in the art. In some instances, these electric fields are utilized in combination with magnetic fields which are used for the purpose of confining the plasma. Electron cyclotron resonance (ECR) plasma processing is one technique for controlling the plasma with the use of electric and magnetic fields.

Plasmas are normally contained in chambers called reactors that separate the plasma from the surrounding work environment. Electrical energy sources and raw-material sources are coupled to the reactors through a variety of interfaces and control circuits. The resulting plasmas are characterized by many properties. Typically, the plasmas contain electrons along with a neutral and charged atoms and molecules of a variety of gas-phase species, all of which have unique, spatially dependent velocity distribution functions. The plasma properties determine the performance of industrial plasma processes.

To achieve certain desired plasma properties, an operator of a plasma-processing system can adjust several controls, each of which is indirectly related to the plasma properties. These controls typically include gas-flow rates, total pressure, and electrical excitation level. The controls also can be modulated and timed during a particular process. It is generally appreciated in the industry that (1) plasma properties are related to such controls in complex ways; that (2) there are a greater number of properties of importance than there are independent controls; and that (3) there is much need for improvement in the ability to control plasma properties. One area for improvement is in developing additional controls so that an operator can have greater capability of achieving desirable set of plasma conditions. The present invention provides for one of these improvements in controlling a set of plasma conditions.

SUMMARY OF THE INVENTION

The present invention describes a technique for taking advantage of the intrinsic electrical non-linearity of processing plasmas to add additional control variables that affect process performance. The technique provides for the adjustment of the electrical coupling circuitry, as well as the electrical excitation level in response to measurements of the reactor voltage and current and to use that capability to modify the plasma characteristics to obtain the desired performance.

In one embodiment, a transmission cable, coupled between the electrical source and the reactor, is varied in length in order to adjust the impedance characteristics of the transmission line. In another embodiment, a variable capacitor circuit is used to simulate a change in the coaxial cable length by changing the electrical characteristics of the transmission medium. By adjusting the electrical characteristics, a particular operating point can be readily obtained wherein each operating point will exhibit a characteristic response of the fundamental and harmonic frequencies of the plasma voltage and current.

BRIEF DESCRIPTION OF THE DRAWINGS

FIG. 5 is a schematic diagram illustrating the use of a variable length coaxial cable to select a desirable operating point.

FIG. 6 is a schematic diagram showing an electrical circuit designed to simulate the variation of the cable length of FIG. 5.

FIG. 9 is a graphical illustration of power magnitude measured by the circuit of FIG. 2 at various capacitance values.

DETAILED DESCRIPTION OF THE PREFERRED EMBODIMENTS

An apparatus and method for providing additional controls for controlling a set of plasma conditions is described. In the following description, numerous specific details are set forth such as specific circuits, reactors, processes, etc., in order to provide a thorough understanding of the present invention. However, it will be obvious to one skilled in the art that the present invention may be practiced without the specific details. In other instances, well-known processes and structures have not been described in detail in order not to unnecessarily obscure the present invention.

Figure 1:
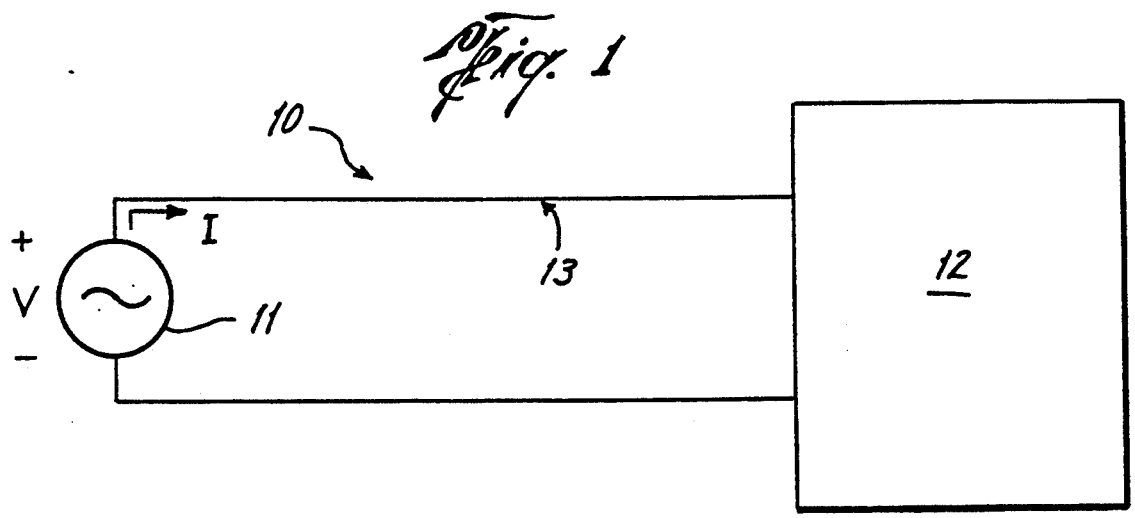
FIG. 1 is a circuit schematic showing a plasma system used with the present invention.

Referring to FIG. 1, a typical plasma reactor system 10 is shown. An electrical source 11 is coupled to a reactor assembly 12 by some form of coupling means 13. Electrical source 11 is typically an RF or a microwave frequency generation source which is used to electrically excite the plasma in the reactor chamber disposed within reactor 12. Coupling means 13 provides the electrical transmission of the electrical energy from source 11 to reactor 12. Typically, coupling means 13 is a transmission line, which is in the form of a cable or a waveguide. Coupling means 13 also can include various filters, matching networks, amplifiers and other components which are used in the coupling of the electrical energy from source 11 to reactor 12.

Various schemes have been devised in the prior art for coupling the generator to the reactor in order to operate as a plasma processing system. For example, in U.S. Pat. No. 4,824,546 (Ohmi) an RF power source is coupled to a vacuum vessel through a matching circuit in order to provide a sputtering apparatus for forming an insulating thin film. Another example is disclosed in U.S. Pat. No. 4,579,618 (Celestino et al.) in which two power sources are each coupled through a matching network to a plasma reactor. U.S. Pat. No. 5,111,111 also describes a unique coupler for matching the source to the reactor.

A key feature of most plasma is that the plasmas have "non-linear" impedance characteristic. Non-linearity is a mathematical definition signifying that the magnitude of the voltage (electric field) in the plasma is not directly proportional to the magnitude of the current (magnetic field). Typically, the generators employed in various plasma systems are designed to generate an output of predominantly singlefrequency. However, because of the non-linearity of the plasma, signals at multiples of the fundamental generator frequency are generated by the plasma. These multiple frequencies of the fundamental are called harmonic frequencies (or harmonics). The harmonics affect certain properties of the plasma such as direct current (DC) bias, which impact the particular plasma process. In some instances, sub-harmonics are generated in which signals below the fundamental frequencies, as well as their multiples, provide additional constraint to the plasma conditions.

With the system of FIG. 1, a variety of prior art techniques rely on only a single control of the level of excitation associated with electrical source 11 to control the plasma. That single control typically adjusts the level of the supply's output power. That is, although source 11 provides an electrical signal having some voltage and current value, typically, prior art techniques call for an adjustment in one of these circuit parameters. Worst yet, at the plasma the electrical excitation will simply be characterized by the value of total power ($E \times I$). This characterization would be quite adequate if the plasmas behaved as a linear system. That is, if the plasma did present a linear impedance to the electrical excitation source 11, then the specification of power at the plasma would uniquely determine a particular voltage and current combination.

Essentially, average power is determined by the cycleaveraged product of voltage and current. Thus, the same average power may result from two or more different voltage and current values. For example, one condition of high voltage and low current can give different process results in the reactor than does another condition of low voltage and high current, even though both conditions have the same total average power. Consequently, due to the non-linear response of the plasma, average power provided by the electrical source 11 to the plasma in reactor 12 may not necessarily provide for a desired response of the plasma. Accordingly, it is appreciated that an independent control of both the voltage and current characteristics, and not just the total power at the plasma, can provide for additional controls to be placed on the plasma and thus obtain optimal performance in utilizing system 10.

The present invention provides for an improved metric of controlling other factors besides the average power source to the reactor. The plasma system of the present invention attempts to adjust several harmonic parameters of the voltage and current instead of relying on the one dimensional control of total average power. This multi-dimensional control capability permits an option of adjusting the process to several different conditions for the purpose of obtaining added performance of the plasma. To demonstrate the ability to realize multi-dimensional control of harmonic features of voltage and current, a particular plasma reactor and system were utilized in experimentation.

Figure 2:
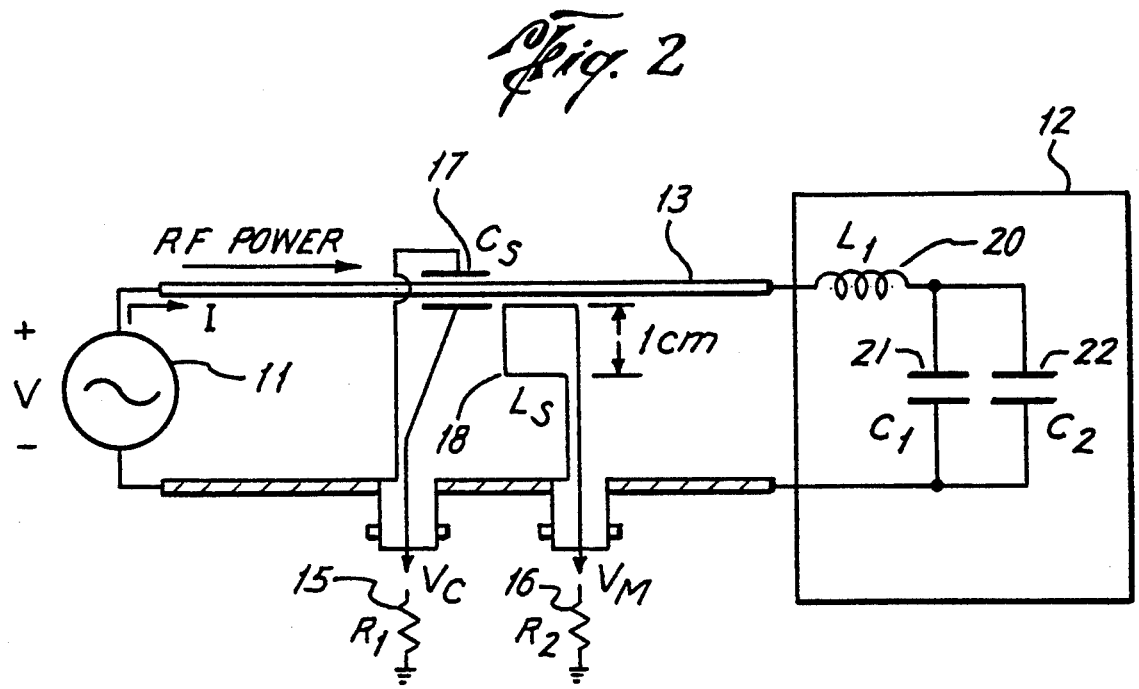
FIG. 2 is a circuit schematic showing a plasma system of FIG. 1 and including voltage and current probes.

Referring to FIG. 2, this particular reactor 12 is generally known in the scientific community as the "GEC RF Reference Cell". It is a radio frequency parallel plate reactor that has four inch diameter electrodes. The GEC RF Reference Cell is further described in an article entitled "Electrical characterization of RF plasmas", Paul A. Miller, SPIE Volume 1594 Process Module Metrology, Control and Clustering, pp. 179–188, (1991). Reactor 12 is excited by a 13.56 MHz electrical source 11 which is capacitively coupled by coupling means 13. The actual frequency of operation is a design choice and the reactor can be operated at a variety of frequencies, 400 KHz, 13.56 MHz and 2.45 GHz being the most notable.

A capacitive voltage probe 17 surrounds the transmission line in order to electrostatically determine the voltage of the signal from source 11. The particular capacitive voltage probe 17 is comprised of a metal tube which surrounds the RF transmission line and which is separated from it by insulation.

A current reading is taken by an inductive current probe 18 coupled proximate to the transmission line in which the electromagnetic field of the transmission line is coupled to the probe for determining the current of the RF signal from source 11. The particular inductive current probe 18 is a loop of insulated wire placed adjacent to the power line so that the magnetic flux from the RF current threads the loop.

In the preferred embodiment capacitance $C_s$ of probe 17 has a value of 3 pF and inductance $L_s$ of probe 18 has a value of 20 nH. The mutual inductance M between probe 18 and coupling means 13 is 3 nH. The outputs from each of the probes 17 and 18 are taken across resistors 15 and 16, respectively. The developed voltage Vc measured across resistor 15 provides the value $R_1 C_s$ dV/dt, which provides the indication of the voltage provided to the plasma in the reactor. The voltage $V_M$ developed across resistor 16, provides the value M dI/dt in order to determine the current being provided to the plasma in reactor 12. The resistance values $R_1$ and $R_2$ for resistors 15 and 16 are each 50 ohms in the preferred embodiment.

The GEC RF reference cell is shown in an equivalent circuit model in FIG. 2. It is comprised of a series inductor 20 and two parallel capacitors 21 and 22. $L_1$ represents the series inductance, $C_1$ represents a shunt capacitance and $C_2$ represents the interelectrode capacitance between the powered and grounded electrodes of the reactor.

This equivalent-circuit models were developed because measured V-I characteristics differed from plasma V-I characteristics. This simple model has been used to convert the measured data to plasma parameters. However, it is to be appreciated that other reactors as well as other equivalent circuits can be readily substituted in place of the equivalent circuit of reactor 12 in FIG. 2.

This GEC RF reference cell and the system shown in FIG. 2 is used to demonstrate the ability to realize multidimensional control of harmonic features of voltage and current. The particular voltage and current probes 17 and 18 shown in FIG. 2 were disposed proximal to the plasma in order to obtain fairly accurate measurements of voltage and current of the plasma.

EXPERIMENTAL RESULTS

The system of FIG. 2 was utilized to conduct the experiment in which the electrical source 11 generated an electrical signal at the fundamental frequency of 13.56 MHz. The particular experiment comprised of maintaining a constant peak-to-peak measured voltage by adjusting the level control of the supply 11, while varying elements of the coupling circuit that coupled the electrical supply 11 to the reactor 12. Voltage and current components of the fundamental and some of the harmonics were measured by the V and I probes of FIG. 2.

Figure 3:
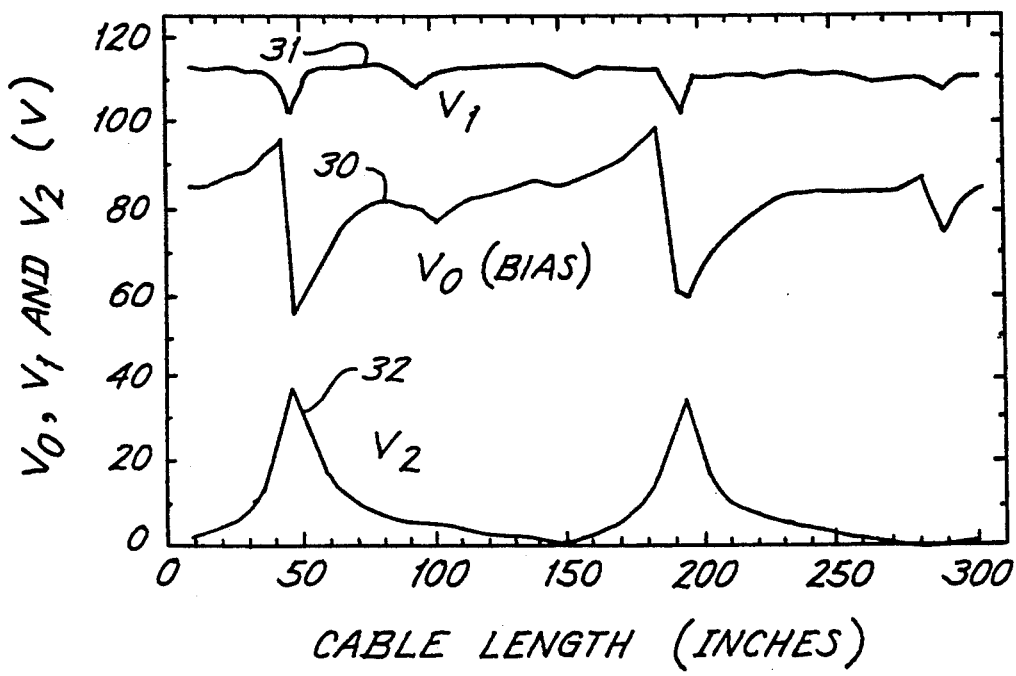
FIG. 3 is a graphical illustration of voltage magnitudes measured by the circuit of FIG. 2 at various cable lengths.
Figure 4:
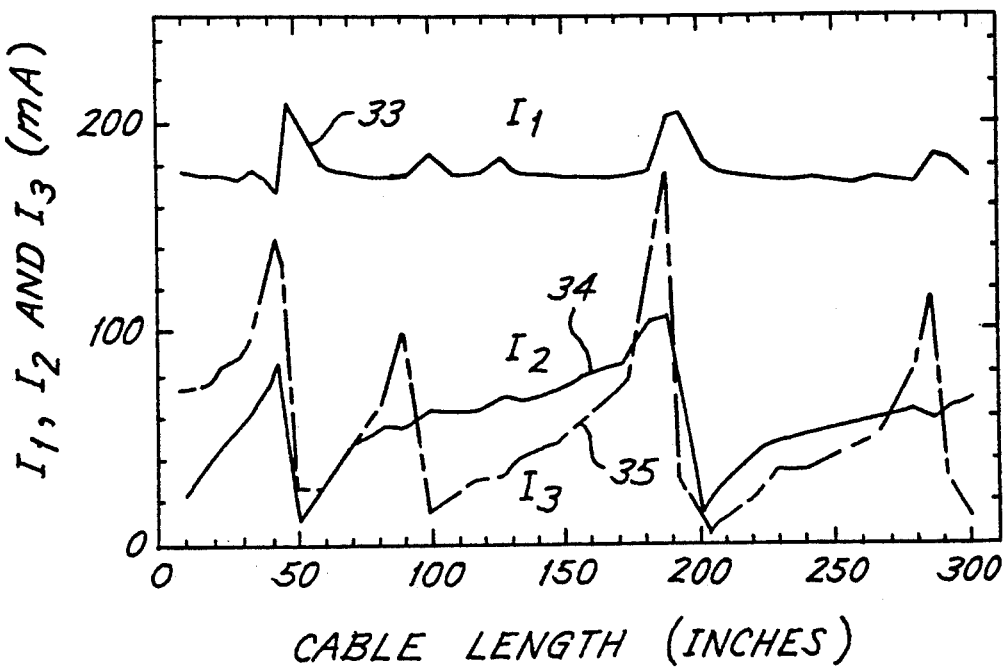
FIG. 4 is a graphical illustration of current magnitudes measured by the circuit of FIG. 2 at various cable lengths.

Referring to FIG. 3 and 4, the V-I measurements are shown to designate values measured as the cable length between source 11 and reactor 12 are varied. The components of voltage and current at the fundamental frequency of 13.56 MHz are denoted as $V_1$ and $I_1$, respectively in FIGS. 3 and 4. Components at the second harmonic (27.12 MHz) are denoted as $V_2$ and $I_2$ and etc., for higher harmonics. The direct-current bias is noted as $V_0$ in FIG. 3. As is noted in FIGS. 3 and 4, patterns 30-35 show the various voltage and current readings as the cable length of coupling means 13 is varied between 0-300 inches. That is, for a substantially constant peak-to-peak voltage from the source 11, a variety of different levels of the fundamental and harmonic voltage and current patterns are obtained.

As is noted in the patterns 30-35, a number of observations can be readily made regarding them. For example, the experimental data show that the dc bias ($V_0$), which is known to be important in microelectronics processing, can be varied from below 60 volts to 100 volts while maintaining the fundamental peak-to-peak voltage ($V_1$) substantially constant. Alternatively, the second and third harmonics of the current can be varied from below 20 milliamperes to above 150 milliamperes, while maintaining a substantially constant peak-to-peak voltage $V_1$. The measured results of the voltage and current as shown in FIGS. 3 and 4 clearly show a new capability in controlling voltage and current that is not available with a simple power level controller of the prior art.

As is noted in FIG. 5, the measured results of FIGS. 3 and 4 were obtained by varying the length of the coaxial cable as part of the coupling means 13 between source 11 and reactor 12. Although, cable length adjustment procedures are adequate for experimentation, the technique is not readily practical in application. Thus, an alternative scheme, as shown in FIG. 6, provides for a more convenient implementation for obtaining the necessary adjustment equivalent to the varying of the length of the coaxial cable. Instead of a physical adjustment of the length of the cable, a cable length variation is achieved by the use of a variable circuit component.

Referring to FIG. 6, an L-C circuit is placed in the transmission line of FIG. 5. The inductor 40 ($L_2$) is placed in series between the input and output terminal while a capacitor 41 ($C_3$), which is a variable capacitor, is shunted across the input terminal. In the particular example, of the preferred embodiment, value of $L_2$ is 0.5 $\mu H$ and $C_3$ has a value of from 10 to 150 pF.

Figure 7:
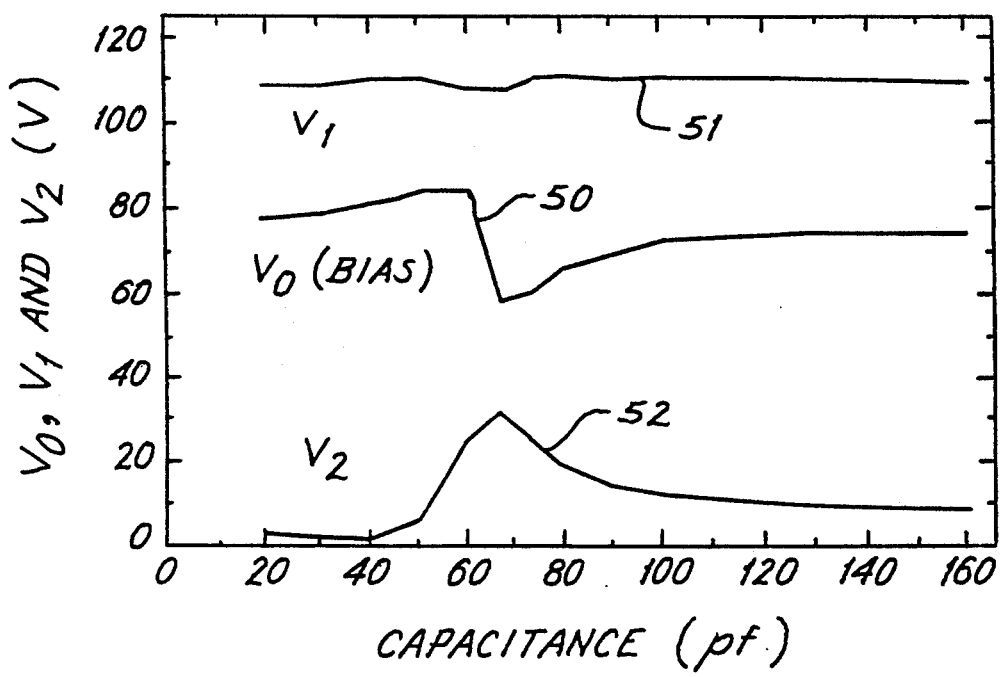
FIG. 7 is a graphical illustration of voltage magnitudes measured by the circuit of FIG. 2 at various capacitance values.
Figure 8:
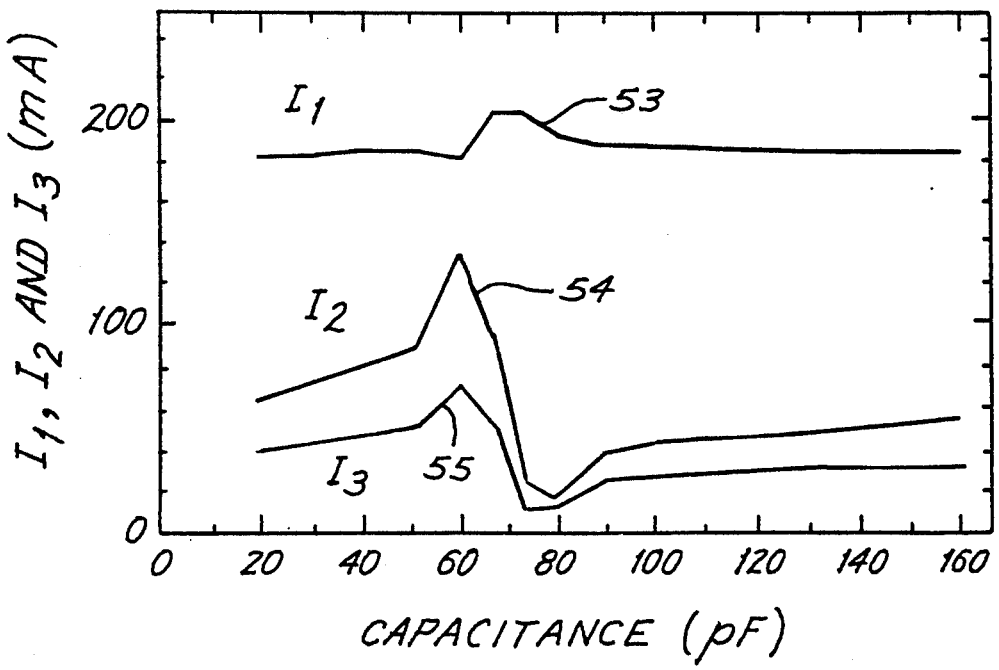
FIG. 8 is a graphical illustration of current magnitudes measured by the circuit of FIG. 2 at various capacitance values.

Referring to FIGS. 7 and 8, the patterns 50-55 denote the various fundamental and harmonic voltages and currents, as well as the dc bias voltage $V_0$, of the plasma in the reactor 12. As is illustrated in FIGS. 7 and 8, the adjustment of the capacitor across its full value of capacitances simulate the transmission line length variation from 150 to 250 inches. As is noted, patterns 50-55 substantially simulate patterns 30-35, respectively, between the ranges of 150-250 inches of cable length.

The actual power delivered to the plasma corresponding to the data shown in FIG. 7 and 8 are shown in FIG. 9. As is noted in FIG. 9, the power levels are relatively low because discharges in the particular experimental gas, argon, behave reactively. That is, the phase angles between the voltage and current are very close to 90 degrees in phase. It is to be noted that etching gases such as chlorine will behave more resistively. It is to be noted that the peak point in the power occurs for a capacitance value of approximately 67 pF, whereas in FIG. 7 it shows that the dc bias $V_0$ is at its lowest value. Such an operating condition of maximum power and minimum bias, when obtained in the appropriate gas mixture, will be desirable for etching of microelectronic devices because etch rate may be fastest and circuit damage would be least.

It is to be appreciated that the above results demonstrate two techniques which can control the impedance of the coupling circuitry to the reactor. The two techniques being the variable cable length technique and the variable capacitance technique. These techniques simultaneously affect the harmonics in a fixed and predictable manner and thus, yield a control variable in addition to the normal RF power level control available at the source 11. It is to be further appreciated that by the use of more complex circuitry it is possible to affect the impedance value of different harmonics independently and thereby obtain additional control variables. The value of the additional degrees of freedom thereby gained will necessarily be balanced against the additional complexity of the required circuitry.

The technique described above demonstrates the feasibility of a scheme for taking advantage of the intrinsic electric non-linearity of processing plasmas to add additional degrees of freedom to the set of control variables that affect process performance. The technique is to adjust electrical coupling circuitry as well as the electrical excitation level in response to measurements of reactive voltage and current and to use that capability to modify the plasma characteristics to obtain the desired process performance.

By knowing the various electrical characteristics of the fundamental and harmonic frequency response of the particular plasma in the reactor, an operative point can be readily selected for a particular semiconductor process to be achieved. A significantly high level of control is available beyond a mere adjustment of power at the electrical source.

Additionally, a matching network, which is commonly known in the prior art as a part of the electrical coupling circuitry of a reactor, can readily serve to adjust the voltage and current of the harmonic components in place of either a variable cable length or a circuit as shown in FIG. 6. However, in that instance the network could not also serve to minimize reflected power at the fundamental frequency. In order to minimize the reflective power as well as adjust the voltage and current of the harmonic components, a circuit such as the one shown in FIG. 6 should be used in addition to a matching network. In that instance, the matching network must be located (electrically), between the adjustable circuit element and the supply 11.

It is to be noted that although a specific reactor is described above, the present invention is not limited to such a reactor. The present invention can be practiced with a variety of reactors and at a variety of frequencies. It is to be further noted that a variety of techniques and known circuit component(s) can be readily utilized to vary the impedance of the electrical transmission medium without departing from the scope and spirit of the invention. Thus, inductors, transformers, resistors, as well as other known circuit components, can be readily used in place of the capacitor or the varying cable length, as is described herein.

We claim:

1. In a plasma processing apparatus, having a reactor for processing a plasma gas and wherein said reactor is coupled to an electrical energy source for generating an electrical signal at a fundamental frequency f in order to provide an electrical energy field for generation of plasma and wherein a non-linear response of said plasma introduces harmonic frequency components of voltage and current of said electrical signal, such that an operating characteristic of said plasma is measurable by observing voltage and current values of said electrical signal at its fundamental frequency and said harmonic frequency components, a combination of said reactor and a variable impedance device coupled between said reactor and said electrical energy source for selecting an operating point of said plasma by adjusting an impedance of said variable impedance device until a desirable electrical operating point of said plasma is selected based on one or more of said fundamental and harmonic frequency components of voltage and current.

2. The apparatus of claim 1 wherein a dc bias voltage from said electrical energy source is observed and utilized to obtain said desirable electrical operating point.

3. The apparatus of claim 1 wherein said variable impedance device adjusts an effective electrical length of a conductor coupled between said variable impedance device and said reactor in order to vary said impedance to select said desirable electrical operating point.

4. The apparatus of claim 1 wherein said variable impedance device includes a variable capacitor in order to vary said impedance to select said desirable electrical operating point.

5. A plasma processing apparatus for processing a plasma gas and in which said apparatus is coupled to an electrical energy source for generating an electrical signal at a fundamental frequency f in order to provide an electrical energy field for generation of plasma and wherein a non-linear response of said plasma introduces harmonic frequency components of voltage and current of said electrical signal, such that an operating characteristic of said plasma is measurable by observing voltage and current values of said electrical signal at its fundamental frequency and said harmonic frequency components comprising:

a reactor for processing said plasma gas therein;

a variable impedance device coupled between said reactor and said electrical energy source for selecting an operating point of said plasma by adjusting an impedance of said variable impedance device until a desirable electrical operating point of said plasma is selected based on one or more of said fundamental and harmonic frequency components of voltage and current.

6. The apparatus of claim 5 wherein a dc bias voltage from said electrical energy source is observed and utilized to obtain said desirable electrical operating point.

7. The apparatus of claim 5 wherein said variable impedance device adjusts an effective electrical length of a conductor coupled between said variable impedance device and said reactor in order to vary said impedance to select said desirable electrical operating point.

8. The apparatus of claim 5 wherein said variable impedance device includes a variable capacitor in order to vary said impedance to select said desirable electrical operating point.

9. A method for processing a semiconductor material by utilizing a plasma process of exposing said semiconductor material to a plasma gas in a reactor wherein said reactor is coupled to an electrical energy source for generating an electrical signal at a fundamental frequency f in order to provide an electrical energy field for generation of plasma and wherein a non-linear response of said plasma introduces harmonic frequency components of voltage and current of said electrical signal, such that an operating characteristic of said plasma is measurable by observing voltage and current values of said electrical signal at its fundamental frequency and said harmonic frequency components comprising: inserting a variable impedance device between said reactor and said electrical energy source to select an operating point of said plasma by adjusting an impedance of said variable impedance device until a desirable electrical operating point of said plasma is selected based on one or more of said fundamental and harmonic frequency components of voltage and current.

10. The method of claim 9 wherein a dc bias voltage from said electrical energy source is observed and utilized to obtain said desirable electrical operating point.

11. The method of claim 9 wherein said variable impedance device adjusts an effective electrical length of a conductor coupled between said variable impedance device and said reactor in order to vary said impedance to select said desirable electrical operating point.

12. The method of claim 9 wherein said variable impedance device includes a variable capacitor in order to vary said impedance to select said desirable electrical operating point.

* * * * *

UNITED STATES PATENT AND TRADEMARK OFFICE
CERTIFICATE OF CORRECTION

PATENT NO. : 5,325,019
DATED : June 28, 1994
INVENTOR(S) : Paul A. Miller and Mattan Kamon It is certified that error appears in the above-indentified patent and that said Letters Patent is hereby corrected as shown below:

Column 1, line 52, remove "a".

Column 2, line 4, after "achieving" insert --a--.

Column 4, lines 12 & 13, "metric" should be --method--.

Column 5, line 67, "Although," should be --Although--.

Column 6, line 25, "Fig." should be --Figs.--.

Signed and Sealed this

Nineteenth Day of August, 1997

Attest:

BRUCE LEHMAN

Attesting Officer   Commissioner of Patents and Trademarks